(12) United States Patent
Prokofiev

(10) Patent No.: US 6,809,260 B1
(45) Date of Patent: Oct. 26, 2004

(54) APPARATUS AND METHOD FOR AN INTEGRATED HIGH-PERFORMANCE ELECTRICAL INTERCONNECT

(75) Inventor: Victor Prokofiev, Phoennix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/667,847

(22) Filed: Sep. 22, 2003

(51) Int. Cl.[7] ............................................... H05K 7/02
(52) U.S. Cl. ........................ 174/52.1; 361/728; 361/807
(58) Field of Search ........................... 174/52.1, 52.2, 174/52.3, 52.4; 361/728, 729, 730, 735, 736, 746, 807, 809

(56) References Cited

U.S. PATENT DOCUMENTS 4,949,224 A * 8/1990 Yamamura et al. ......... 361/784
5,559,676 A * 9/1996 Gessaman ................... 361/752
5,642,261 A * 6/1997 Bond et al. ................. 361/704
6,362,518 B1 * 3/2002 Yatsuda ...................... 257/678

* cited by examiner

Primary Examiner—Dean A. Reichard
Assistant Examiner—Carmelo Oliva
(74) Attorney, Agent, or Firm—Buckley, Maschoff & Talwalkar LLC (57) ABSTRACT

According to some embodiments, an integrated high-quality printed circuit board is provided. For example, a first integrated circuit device may be mounted on both a first printed circuit board and a second printed circuit board (e.g., a polyimide film having better dielectric characteristics as compared to the first board). A second integrated circuit device may be located remote from the first integrated circuit device and may also be mounted on both the first and second boards.

12 Claims, 9 Drawing Sheets

APPARATUS AND METHOD FOR AN INTEGRATED HIGH-PERFORMANCE ELECTRICAL INTERCONNECT

BACKGROUND

A printed circuit board may be used to enable signaling between devices, such as processors or other types of integrated circuits. For example, two or more devices may be mounted on a rigid, non-conducting substrate and signals may be transmitted between the devices via conductive paths, called "traces," that are attached to the substrate.

To accommodate signals that are transmitted at relatively high rates, however, the quality of a printed circuit board may need to be improved. For example, a high-speed system bus may require that a substrate be formed using a substantially homogeneous material. Similarly, high-speed signaling may require more precise manufacturing techniques (e.g., to reduce variations in the width of the traces). As a result, the cost of a printed circuit board may be increased and/or the board may be more difficult to manufacture.

DETAILED DESCRIPTION

Figure 1:
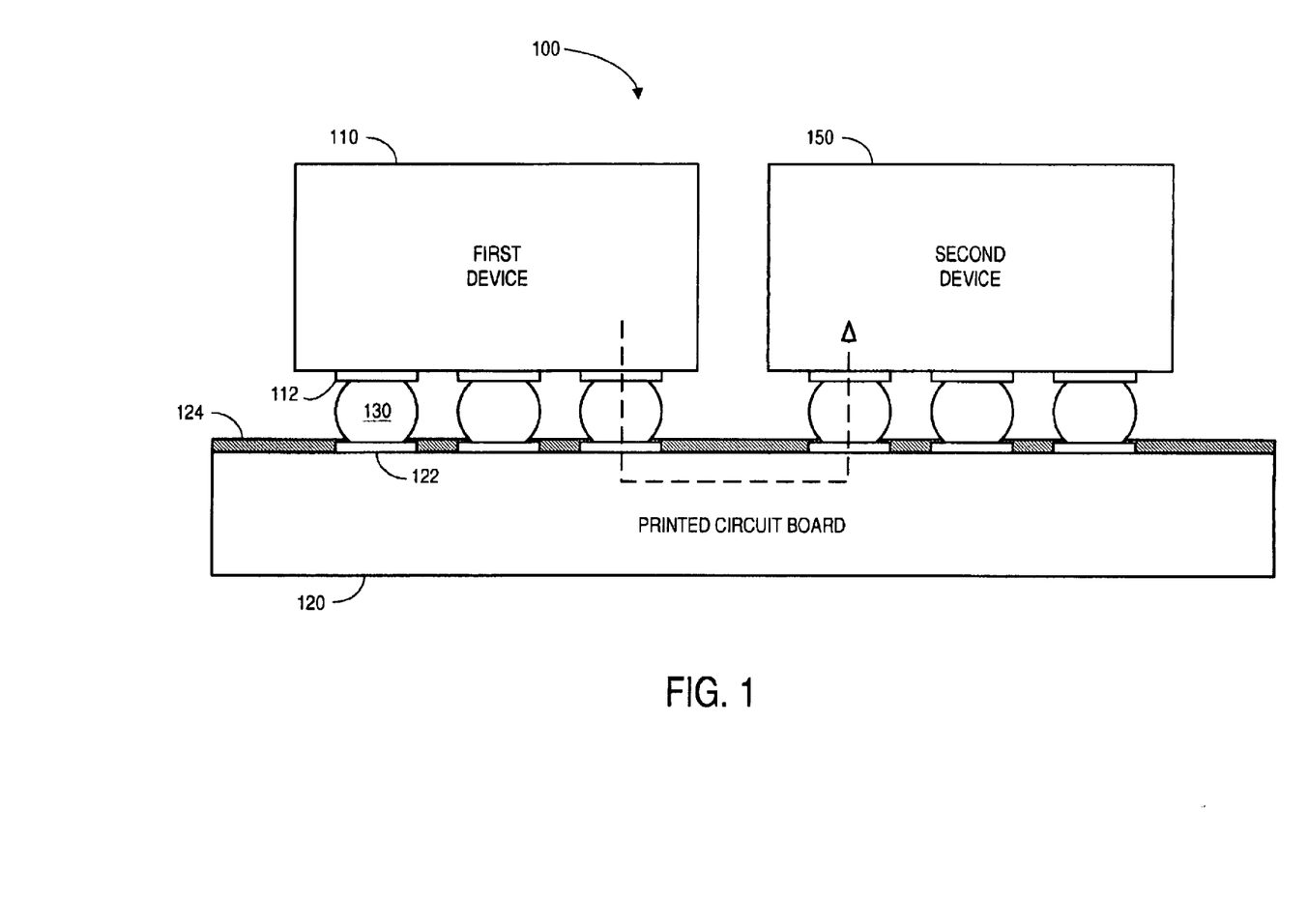
FIG. 1 is a block diagram of an apparatus including two devices coupled to a printed circuit board.

FIG. 1 is a block diagram of an apparatus 100 that includes two devices 110, 150 coupled to a rigid, non-conducting substrate 120. The devices 110, 150 may be, for example, integrated circuit packages or a sockets adapted to receive integrated circuits.

As represented by the dashed line in FIG. 1, the first device 110 may transmit a signal to the second device through a pad 112. The signal may then travel through a solderball joint 130 to a printed circuit board pad 122. Note that a solder mask 124 may comprise a coating that has been applied over selected areas of the substrate 120 such that only uncoated areas are soldered (e.g., the board pads 122).

The signal may then travel along a trace (e.g., a copper path that has been etched onto the substrate 120) to reach the second device 150 (e.g., via another printed circuit board pad 122, a solderball joint 130, and a pad 112 on the second device 150).

To maintain signal integrity when signals are transmitted at a relatively high rate, the quality of the printed circuit board may need to be increased. For example, the substrate 120 may need to be formed using a higher-quality (e.g., more homogeneous) insulating medium or "dielectric material." In addition, traces and through-holes (e.g., "vias" that are used to connect conductors on different sides or layers of the substrate 120) might need to be formed with increased accuracy. As a result, the cost of a printed circuit board may be increased and/or high-volume manufacturing may be impractical.

Figure 2:
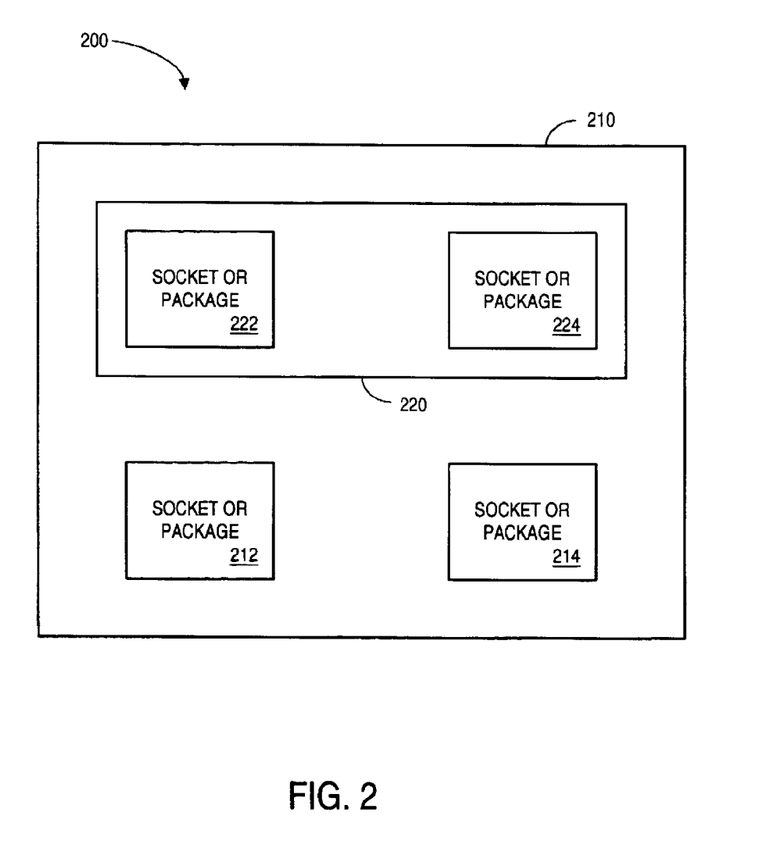
FIG. 2 is a block diagram of an apparatus according to some embodiments.

FIG. 2 is a block diagram of an apparatus 200 according to some embodiments. In this case, a lower-quality printed circuit board portion 210 may enable signaling between some devices 212, 214 while a higher-quality printed circuit board portion 220 enables signaling between other devices 222, 224. The devices may be associated with, for example, a socket, a package, a chip-set, a processor, a peripheral interface, and/or an input output device.

The lower-quality portion 210 may be formed, for example, using a lower-quality dielectric material while the higher-quality portion 220 is formed using a higher-quality (e.g., more homogeneous) dielectric material. The higher-quality dielectric material may, for example, improve skew and dispersion characteristics of the higher-quality portion 220 allowing for higher-speed signaling as compared to the lower-quality portion 210. As one example, the dielectric material used for the higher quality portion 220 may comprise KAPTON® polyimide film available from DUPONT®.

According to some embodiments, the higher-quality portion 220 is relatively thin and is formed with more stringent manufacturing tolerances (e.g., for the substrate, vias, and traces) as compared to the lower-quality portion 210.

As a result, the higher-quality portion 220 may have improved signaling characteristics as compared to the lower-quality portion 210. Note, however, that the improved materials and/or manufacturing tolerances might make production of the high-quality portion 220 more expensive and/or difficult as compared to the lower-quality portion 210. By using the high-quality portion 220 only in areas where high-speed signaling is desired (e.g., for a high-speed interconnect between devices 222, 224 or a system bus), the cost of the apparatus 200 may be reduced. Moreover, existing technologies and board design procedures (e.g., that are appropriate for high-volume manufacturing) may be used for the lower-quality portion 210.

Figure 4:
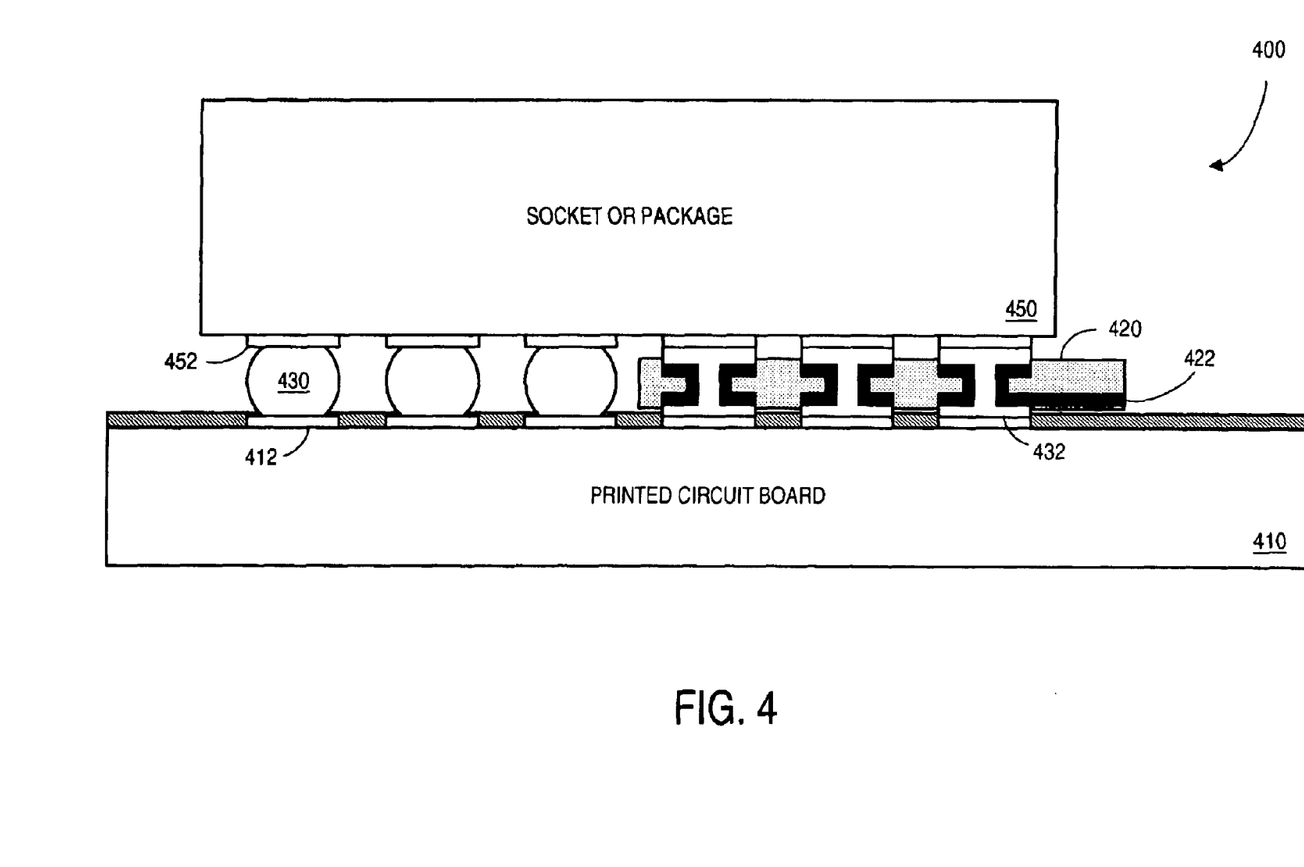
FIG. 4 is a side-view of an apparatus according to some embodiments.

As described with respect to FIG. 4, the higher-quality portion 220 may be integrated into a solderjoint interface area between the devices 222, 224 and the lower-quality portion 210. In addition, at least a portion of the devices 222, 224 may be electrically connected to both the higher-quality portion 220 and the lower-quality portion 210.

Figure 3:
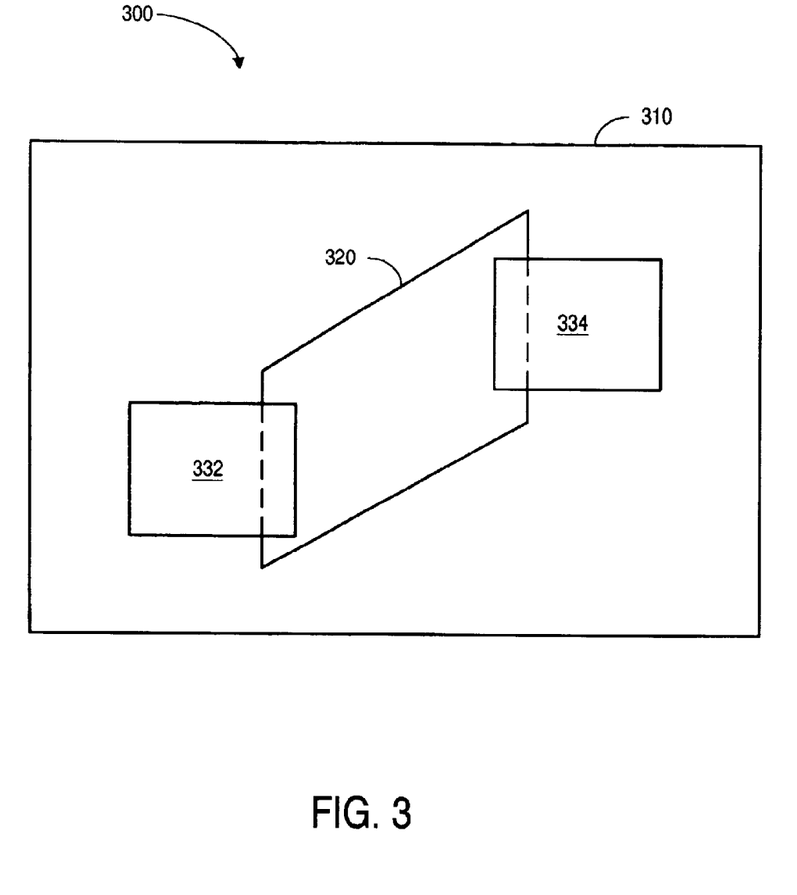
FIG. 3 is a block diagram of an apparatus according to another embodiment.

As illustrated in FIG. 2, the entire devices 222, 224 can be electrically coupled to the higher-quality portion 220 (e.g., all pins of the devices 222, 224 may be soldered to the higher-quality portion 220). FIG. 3 is a block diagram of an apparatus 300 according to another embodiment. In this case, some pins of a first device 332 can exchange signals with some pins of a second device 334 through a higher-quality printed circuit board portion 320 while other pins exchange signals via a lower-quality printed circuit board portion 310. For example, the first device 332 might be a chip-set, the second device 334 may be a processor, and the processor and chip-set may communicate via a high-speed bus formed on the higher-quality portion 320. According to other embodiments, some devices are entirely electrically coupled to the higher-quality portion 320 while other devices are only partially coupled.

The higher-quality portion 320 might be integrated into a solderjoint interface area between the devices 332, 334 and the lower-quality portion 310. For example, FIG. 4 is a side-view of an apparatus 400 according to some embodiments. Some pins of a device 450 (e.g., a socket or package) are coupled to a lower-quality substrate 410 via a pad 452, a solderball 430, and a circuit board pad 412.

With other pins, a thin board 420 of dielectric material is provided in the solderjoint 432 interface area between the device 450 and the substrate 410 (e.g., the solderjoint 432 extending through vias in the thin board 420). These pins can then exchange signals via traces 422 on the thin board 420. That is, the substrate 410 may be associated with the lower-quality portion 310 in FIG. 3 while the thin board 420 (and traces 422) are associated with the higher-quality portion 320. Note that the traces 422 could be formed on one or more conductor layers (e.g. a single layer design might be used for differential signaling while a two layer design is used for a single-ended application).

The arrangement illustrated in FIG. 4 may improve thermal characteristics (e.g., a thermal solution might not be obscured) and/or provide moisture resistance to further enhance high-speed signaling performance. Moreover, the additional space that is available may reduce cross-talk, and the impedance characteristics of the apparatus 400 may be improved.

Figure 5:
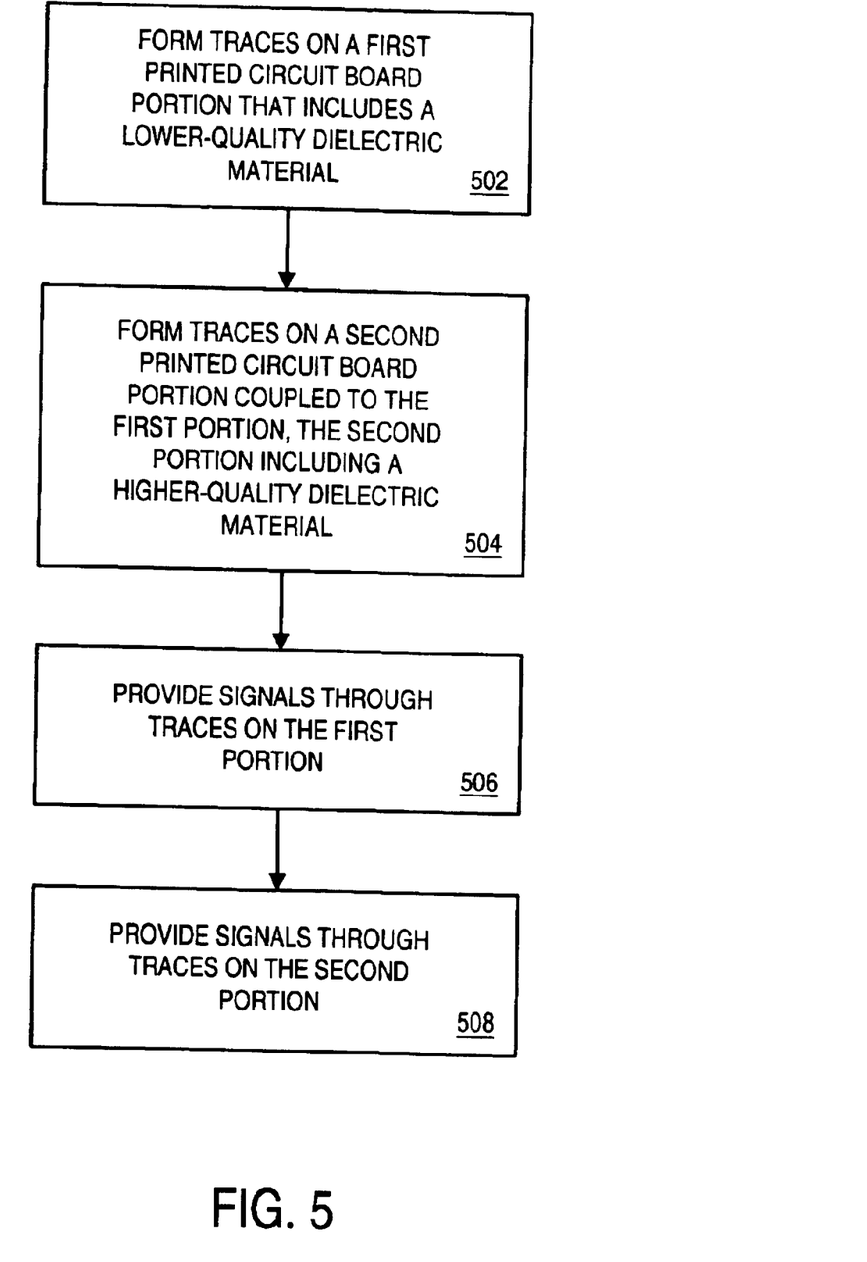
FIG. 5 is a flow chart of a method according to some embodiments.

FIG. 5 is a flow chart of a method according to some embodiments. The flow chart does not necessarily imply a fixed order to the actions, and embodiments may be performed in any order that is practicable. The method of FIG. 5 may be associated with, for example, the apparatus 400 of FIG. 4.

At 502, traces are formed on a first printed circuit board portion. The first portion may comprise, for example, a board having a lower-quality dielectric material. At 504, traces are formed on a second printed circuit board portion. The second portion may comprise, for example, a thin board having a higher-quality dielectric material. At 506, signals are provided through traces on the first portion (e.g., low-speed signals). At 508, signals are provided through traces on the second portion (e.g., high-speed signals associated with a system bus).

Figure 6:
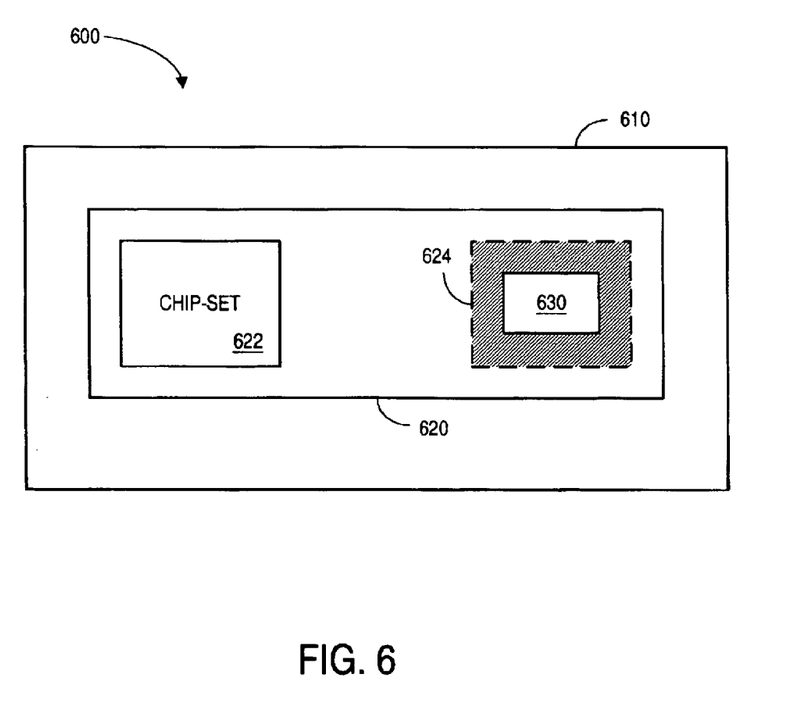
FIG. 6 is a block diagram of an apparatus according to another embodiment.

FIG. 6 is a block diagram of an apparatus 600 according to another embodiment. In this case, a chipset 622 is coupled to a higher-quality printed circuit board portion 620. The higher-quality portion 620 includes an area 624 (represented by dashed lines in FIG. 6) where a processor may be mounted. The higher-quality portion 620 may also include a hole 630 through which the processor can be coupled to a lower-quality printed circuit board portion 610. For example, the shaded area in FIG. 6 might be used to couple processor pins associated an Input Output (IO) ring or bus to the higher-quality portion 620 while the hole 630 is used to couple pins associated with power connections to the lower-quality portion 610. In this way, the processor may exchange information with the chipset 622 via the high-speed IO bus (while power connections will not require a higher-quality, and more expensive, printed circuit board).

Figure 7:
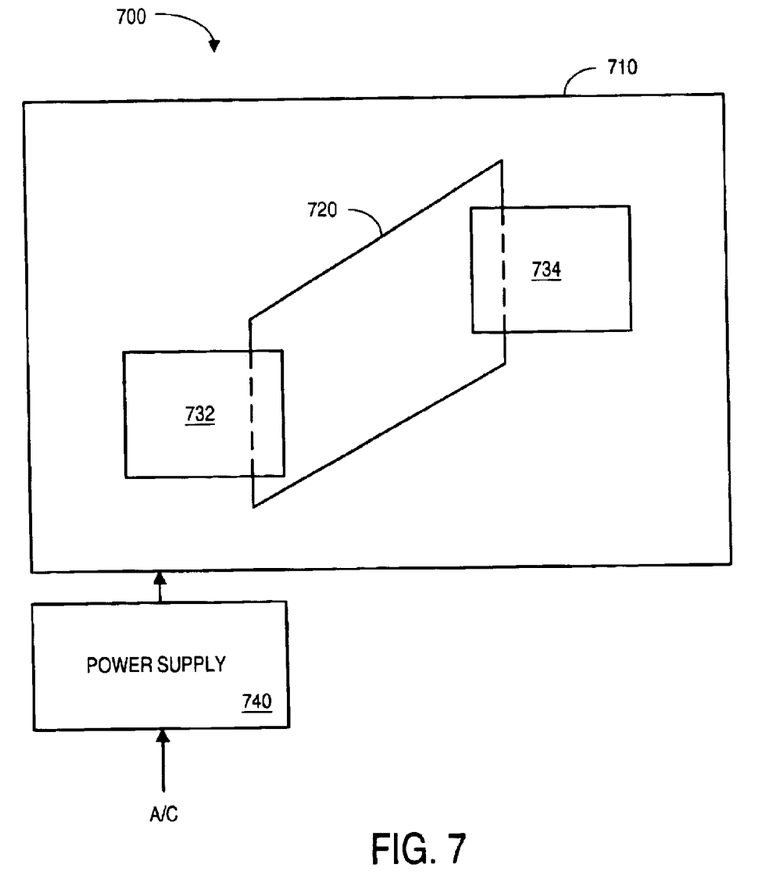
FIG. 7 illustrates a system according to some embodiments.

FIG. 7 illustrates a system 700, such as a Personal Computer (PC) or server, according to some embodiments. The system includes a lower-quality printed circuit board portion 710 as well as devices 732, 734 coupled via a higher-quality printed circuit board portion 720. The system further includes a power supply 740 to receive Alternating Current (AC) power and to provide Direct Current (DC) power to the lower-quality portion 710. According to some embodiments, the higher-quality portion 720 is integrated into a solderjoint interface area between the devices 732, 734 and the lower-quality portion 710.

The following illustrates various additional embodiments. These do not constitute a definition of all possible embodiments, and those skilled in the art will understand that many other embodiments are possible. Further, although the following embodiments are briefly described for clarity, those skilled in the art will understand how to make any changes, if necessary, to the above description to accommodate these and other embodiments and applications.

Figure 8:
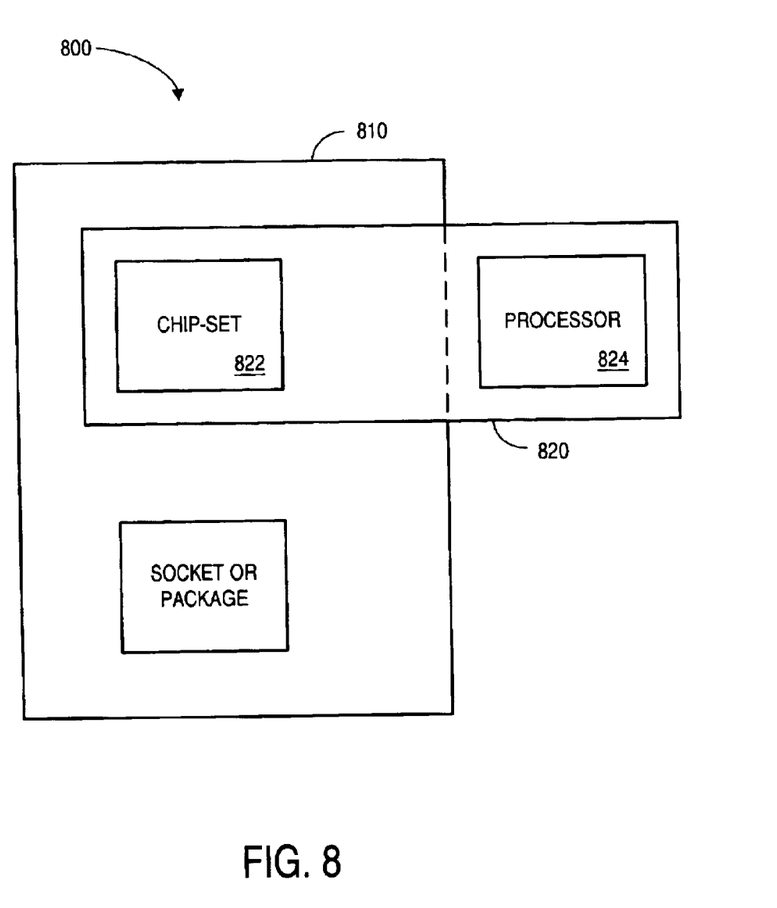
FIG. 8 is a block diagram of an apparatus according to still another embodiment.

Although specific printed circuit board arrangements have been described, embodiments may be used in connection with any type of layout. For example, FIG. 8 is a block diagram of an apparatus 800 according to still another embodiment. In this case, part of a higher-quality printed circuit board portion 820 extends beyond the lower-quality printed circuit board portion 810. For example, a chip-set 822 might be electrically coupled to both the lower-quality portion 810 and the higher-quality portion 820 while a processor 824 is only coupled to the higher-quality portion 820.

Figure 9:
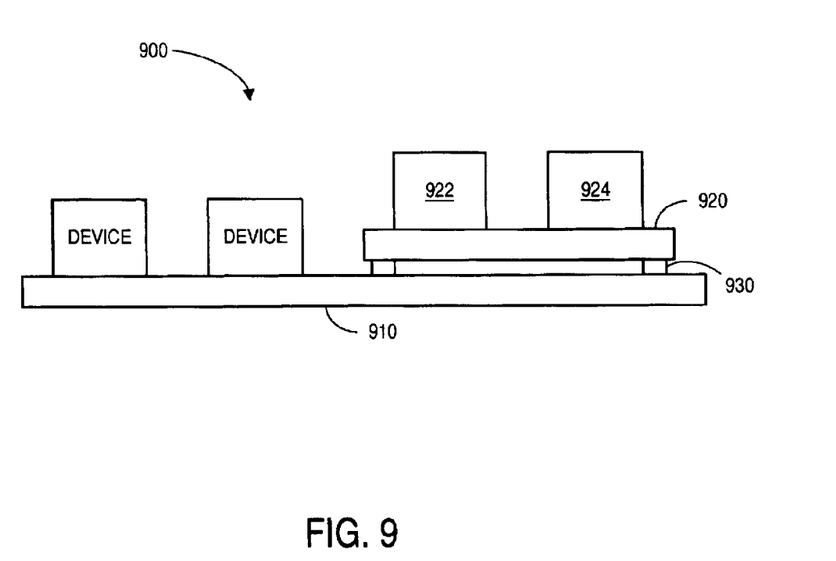
FIG. 9 is a side-view of an apparatus according to yet another embodiment.

FIG. 9 is a side-view of an apparatus 900 according to yet another embodiment In this case, a higher-quality portion 920 is not integrated into a solderjoint interface area between devices 922, 924 and a lower-quality portion 910. Instead, the devices 922, 924 are soldered to the higher-quality portion 920 which in turn is attached to the lower-quality portion 910 via coupling elements 930 (e.g., screws, glue, or other fastening elements).

The several embodiments described herein are solely for the purpose of illustration Persons skilled in the art will recognize from this description other embodiments may be practiced with modifications and alterations limited only by the claims.

What is claimed is:

1. An apparatus, comprising:
   a first printed circuit board;
   a second printed circuit board;
   a first integrated circuit device having a first set of signal contacts attached to a first area of the first board via solderjoint interfaces and a second set of signal contacts attached to a first area of the second board via solderjoint interfaces; and
   a second integrated circuit device having a first set of signal contacts attached to a second area of the first board, remote from the first area of the first board via a solderjoint interface and a second set of signal contacts attached to a second area of the second board, remote from the second area of the first board, via solderjoint interfaces;
   wherein the second board is integrated into the solderjoint interfaces between (i) the first and second integrated circuit devices and (ii) the first printed circuit board .

2. The apparatus of claim 1, wherein the first board is made of a first material and the second board is made of a second material, and the second material is substantially more dielectric than the first material.

3. The apparatus of claim 1, wherein the second printed circuit board comprises a polyimide film.

4. The apparatus of claim 1, wherein at least one of the integrated circuit devices comprises at least one of: (i) a socket, (ii) a package, (iii) a chip-set, (iv) a processor, (v) a peripheral interface, or (vi) an input output device.

5. The apparatus of claim 1, wherein the first board is made of a first material and the second board is made of a second material, and the second material is substantially more homogeneous than the first material.

6. The apparatus of claim 1, wherein the second board is thinner than the first board.

7. A method, comprising:

forming traces on a first printed circuit board;

forming traces on a second printed circuit board;

mounting a first integrated circuit device such that a first set of signal contacts are attached to a first area of the first board via solderjoint interfaces and a second set of signal contacts are attached to a first area of the second board via solderjoint interfaces; and mounting a second integrated circuit device such that a first set of signal contacts are attached to a second area of the first board, remote from the first area of the first board, via a solderjoint interface and a second set of signal contacts are attached to a second area of the second board, remote from the second area of the first board, via solderjoint interfaces;

wherein the second board, is integrated into the solderjoint interfaces between (i) the first and second integrated circuit devices and (ii) the first printed circuit board.

8. The method of claim 7, wherein the first board, is made of a first material and the second board, is made of a second material, and the second material is substantially more dielectric than the first material.

9. A method, comprising:

providing signals through traces on a first printed circuit board;

providing signals through traces on a second printed circuit from a first integrated circuit device to a second integrated circuit device;

wherein the first integrated circuit device has a first set of signal contacts attached to a first area of the first board, via solderjoint interfaces and a second set of signal contacts attached to a first area of the second board, via solderjoint interfaces.

wherein a second integrated circuit device has a first set of signal contacts attached to a second area of the first board, remote from the first area of the first board, via a solderjoint interface and a second set of signal contacts attached to a second area of the second board, remote from the second area of the first board, via solderjoint interfaces, and wherein the second board, is integrated into the solderjoint interfaces between (i) the first and second integrated circuit devices and (ii) the first printed circuit board.

10. The method of claim 9, wherein the first board, is made of a first material and the second board, is made of a second material, and the second material is more dielectric than the first material.

11. A system, comprising:

a power supply to receive alternating current power and to provide direct current power;

a first printed circuit board;

a second printed circuit board;

a first integrated circuit device having a first set of signal contacts attached to a first area of the first board, via solderjoint interfaces and a second set of signal contacts attached to a first area of the second board, via solderjoint interfaces; and a second integrated circuit device having a first set of signal contacts attached to a second area of the first board, remote from the first area of the first board, via a solderjoint interface and a second set of signal contacts attached to a second area of the second board, remote from the second area of the first board, via solderjoint interfaces;

wherein the second board, is integrated into the solderjoint interfaces between (i) the first and second integrated circuit devices and (ii) the first printed circuit board.

12. The system of claim 11, wherein the first board, is made of a first material and the second board, is made of a second material, and the second material is substantially more dielectric than the first material.

* * * * *